US005289332A

United States Patent [19]

Senn et al.

[11] Patent Number: 5,289,332

[45] Date of Patent: Feb. 22, 1994

[54] PROTECTIVE CIRCUIT FOR A CONTROL CIRCUIT, IN PARTICULAR OF LIQUID CRYSTAL DISPLAY SCREEN

[75] Inventors: Patrice Senn; Alan Lelah, both of Grenoble; Gilbert Martel, Meylan, all of France

[73] Assignee: France Telecom Etablissement Autonome de Droit Public (Centre National d'Etudes des Telecommunications), Issy les Moulineaux, France

[21] Appl. No.: 764,211

[22] Filed: Sep. 23, 1991

[30] Foreign Application Priority Data

Sep. 21, 1990 [FR] France ............................... 90 11681

[51] Int. Cl.$^5$ .......................................... H03K 17/687

[52] U.S. Cl. ....................................... 361/1; 307/115; 307/353; 307/572

[58] Field of Search ........................... 361/56, 52, 111; 341/122; 307/572, 491, 353, 115

[56] References Cited

U.S. PATENT DOCUMENTS 4,438,354 3/1984 Haque et al. ........................ 307/491
4,781,437 11/1988 Shields et al. ...................... 350/332

FOREIGN PATENT DOCUMENTS 0381429 8/1990 European Pat. Off. .
2458117 12/1980 France .
2146479 4/1985 United Kingdom .

*Primary Examiner*—Todd DeBoer
*Attorney, Agent, or Firm*—Oblon, Spivak, McClelland, Maier & Neustadt

[57] ABSTRACT

Control protective circuit, in particular of liquid crystal display screen. The protective circuit includes three transistors making possible the transfer of the voltage to output pin, the resetting of middle point and the resetting of the output. Application to the control of liquid crystal display screens.

15 Claims, 4 Drawing Sheets

PROTECTIVE CIRCUIT FOR A CONTROL CIRCUIT, IN PARTICULAR OF LIQUID CRYSTAL DISPLAY SCREEN

BACKGROUND OF THE INVENTION

1. Field of the Invention

This invention has as its object a protective circuit for a control circuit. It finds a preferred application in the control of liquid crystal display screens.

2. Discussion of the Background

A liquid crystal display screen is generally in the form illustrated in FIG. 1. The screen itself, ECR, consists of addressing lines L and columns C, of a matrix of pixels P, each connected to a transistor TFT whose state is controlled by an associated line L and column C.

Such a screen is controlled by a line control circuit CCL, which sequentially applies an addressing voltage (for example, several volts) to the lines, and by a column control circuit CCC, which applies, to all the columns, voltages reflecting the light intensity of the points to be displayed on the addressed line. The overall image is thus displayed line by line.

Column control circuit CCC receives a video signal SV delivered by a video circuit CV. This signal generally consists of three components corresponding to the three primary components of a color image.

If screen ECR has 162 columns, circuit CCC comprises 162 elementary column control circuits, placed in parallel, and 162 outputs connected to various columns. Each elementary column control circuit (also called "driver column" in the technical literature) comprises a sample and hold circuit whose function is to sample the video signal at a given moment corresponding to the column to be controlled and to hold this sample on the column for the entire addressing period of a line ("sample and hold" function in English terminology).

This invention relates to such a sample and hold circuit.

Most liquid crystal display screens require a control voltage on the order of 12 V peak to peak. The recourse to a control circuit supporting such a voltage would limit the possibilities of integration as well as the operating speed. Now, for large-size screens, a high integration density is necessary and a high control speed is desirable.

It is therefore preferred to work with circuits delivering only 6 V peak to peak, but by providing devices on the screen, such as the use of a counterelectrode. By reversing polarity applied to the counterelectrode, it is possible to use a voltage excursion going respectively from 0 to 6 V and from −6 V to 0, in other words to using 12 V peak to peak (from −6 V to +6 V).

However, these devices present the drawback of bringing parasitic voltages to the control circuit, mainly at the time of switchings. An output transistor can thus see 12 V between its drain and its source. Breakdown and avalanche phenomena appear, which result in deterioration of the circuit.

SUMMARY OF THE INVENTION

This invention has as its object to remedy these drawbacks. For this purpose, it proposes a protective circuit comprising a set of transistors used for switches. A suitable switching of these transistors assures a resetting of an intermediate point and limits the risks of excess voltage.

Specifically, this invention has as its object a protective circuit intended to be interposed between, on the one hand, the output of a control circuit comprising means for sampling an input signal, in particular a video signal, and means for the storing and transfer of the samples obtained, and, on the other hand, an output pin intended to be connected to an output terminal for receiving said samples, this output can be, in particular, a liquid crystal display column, and the circuit being intended to protect the means of the control circuit relative to excessive voltages which may to appear on the output pin, this protective circuit being characterized by the fact that it comprises: a first electronic switch and a second electronic switch mounted in series and a third electronic switch mounted between a point located between the first and second switches and a point brought to a zero potential, and means to deliver control signals from these switches, at each sample delivered by the control circuit:

a) to close the first and the second and to open the third to transfer the sample from the control circuit to the output pin, b) to open the first and the second and to close the third, to bring a zero potential between the first and the second switches, c) to close the second and third, to bring the output pin to a zero potential.

This circuit can be applied to the production of a double control circuit making it possible to have, on a single output pin, an output voltage going from −V to +V (or an excursion of 2 V) without the transistors composing this circuit having the possibility of seeing at their terminals a voltage exceeding V. Such a circuit comprises two control circuits similar to the circuit defined above, these circuits working alternately and receiving video input signals of opposite polarities, the respective electronic switches of the two protective circuits being controlled by complementary signals, the two protective circuits being connected to a single output pin.

BRIEF DESCRIPTION OF THE DRAWINGS

The characteristics and advantages of the invention will be understood better in light of the following description. This description relates to embodiments, given by way of explanatory and not at all limiting examples and it refers to the accompanying drawings in which.

DESCRIPTION OF THE PREFERRED EMBODIMENTS

Figure 1:
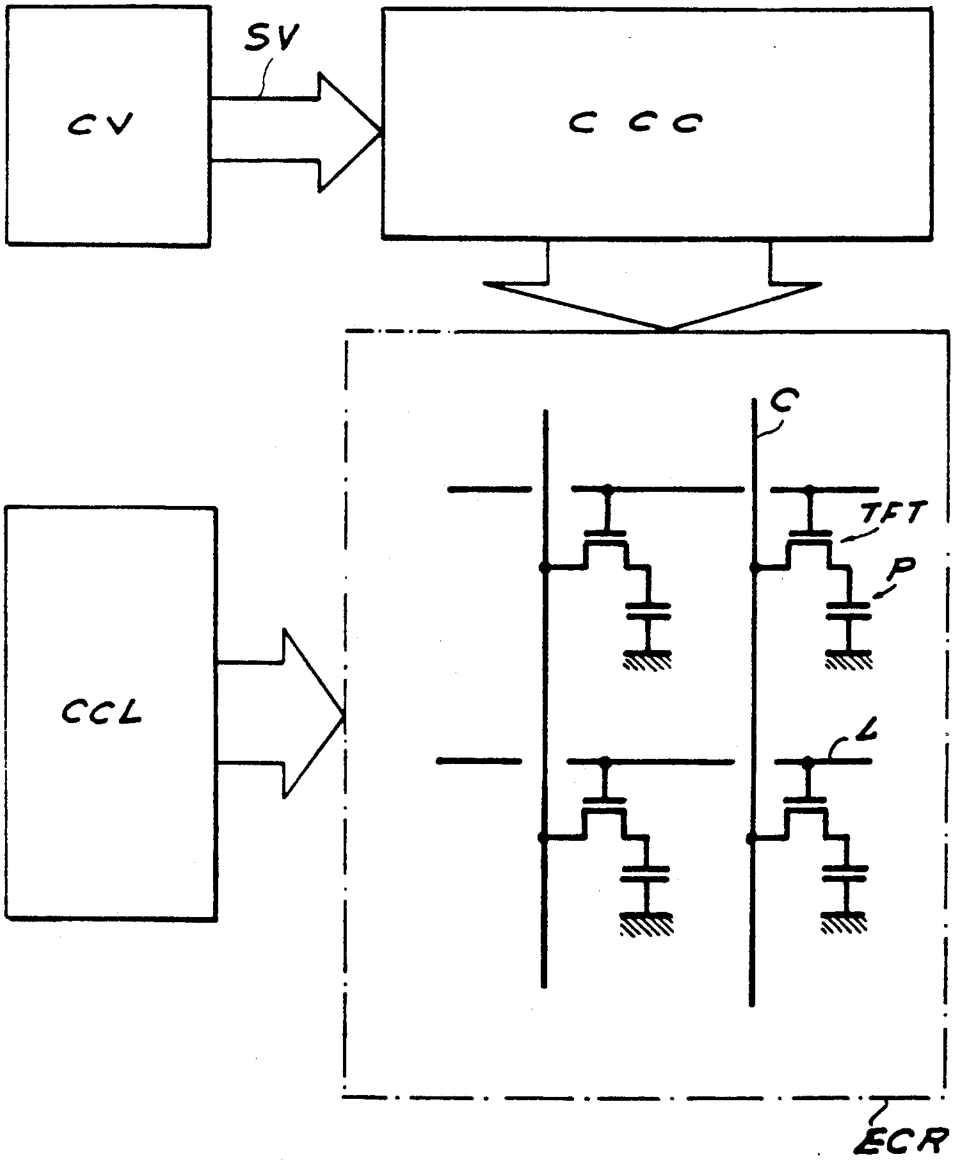
FIG. 1 (PRIOR ART)
FIG. 1, already described, diagrammatically shows a liquid crystal display screen.
Figure 2:
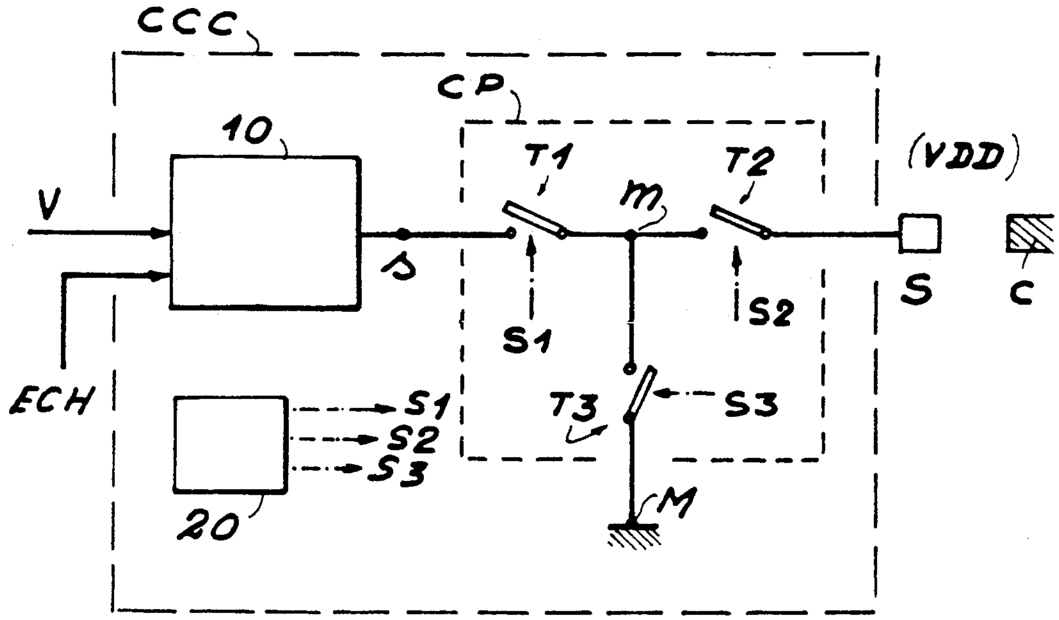
FIG. 2 illustrates a control circuit with protected output according to the invention.

Column control circuit CCC represented in FIG. 2 comprises means 10 able to deliver a voltage pulse. In the case of the control of the columns of a liquid crystal display screen, it is a sample and hold circuit receiving a video voltage V and sampling the latter at a moment defined by a sampling pulse ECH. An example of such a circuit will be illustrated in FIG. 4. On output s of means 10 a voltage thus appears which is the voltage having to be transferred to an output pin S finally to be applied to column C of the screen. According to the invention, control circuit CCC further comprises a protective circuit CP consisting of three electronic switches, in practice transistors, respectively T1, T2 and T3. Transistors T1 and T2 are mounted in series between output s and pin S. The third, T3, is mounted between middle point m and a grounded point M. These three transistors are controlled by signals S1, S2, S3 delivered by a circuit 20.

Figure 3:
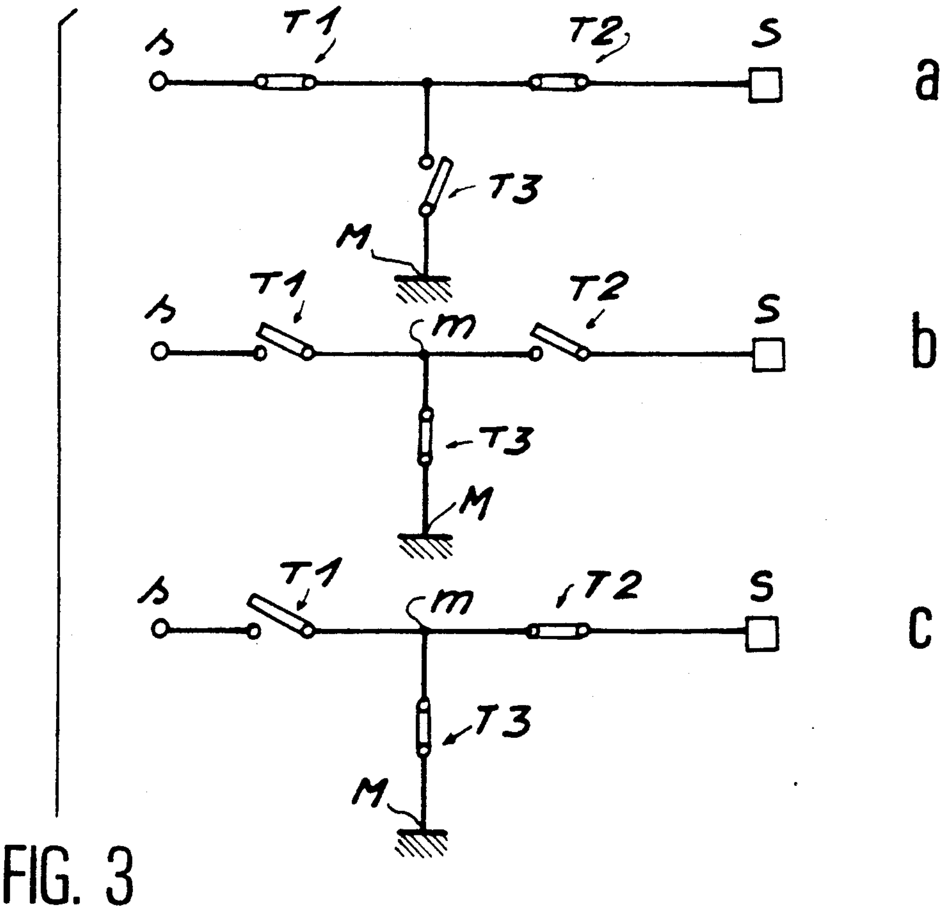
FIG. 3 shows the three states of the protective circuit.

The operation of the protective circuit is illustrated in FIG. 3. This operation comprises three phases:

a) first phase: T1 and T2 are closed and T3 is open: the control voltage available on output s is transferred to output pin S;

b) second phase: T1 and T2 are open and T3 is closed: middle point m is grounded while output s is isolated from the output pin;

c) third phase: T1 remains open, T2 and T3 are closed: the output pin is grounded.

To apply a new pulse to column C, during the scanning of a new line, the same cycle is repeated.

It is therefore seen that, in each of the three preceding stages, the transistors never see more than a voltage V between their terminals, if V is the amplitude of the control voltage, in spite of all the disturbances able to be brought by the column.

Figure 4:
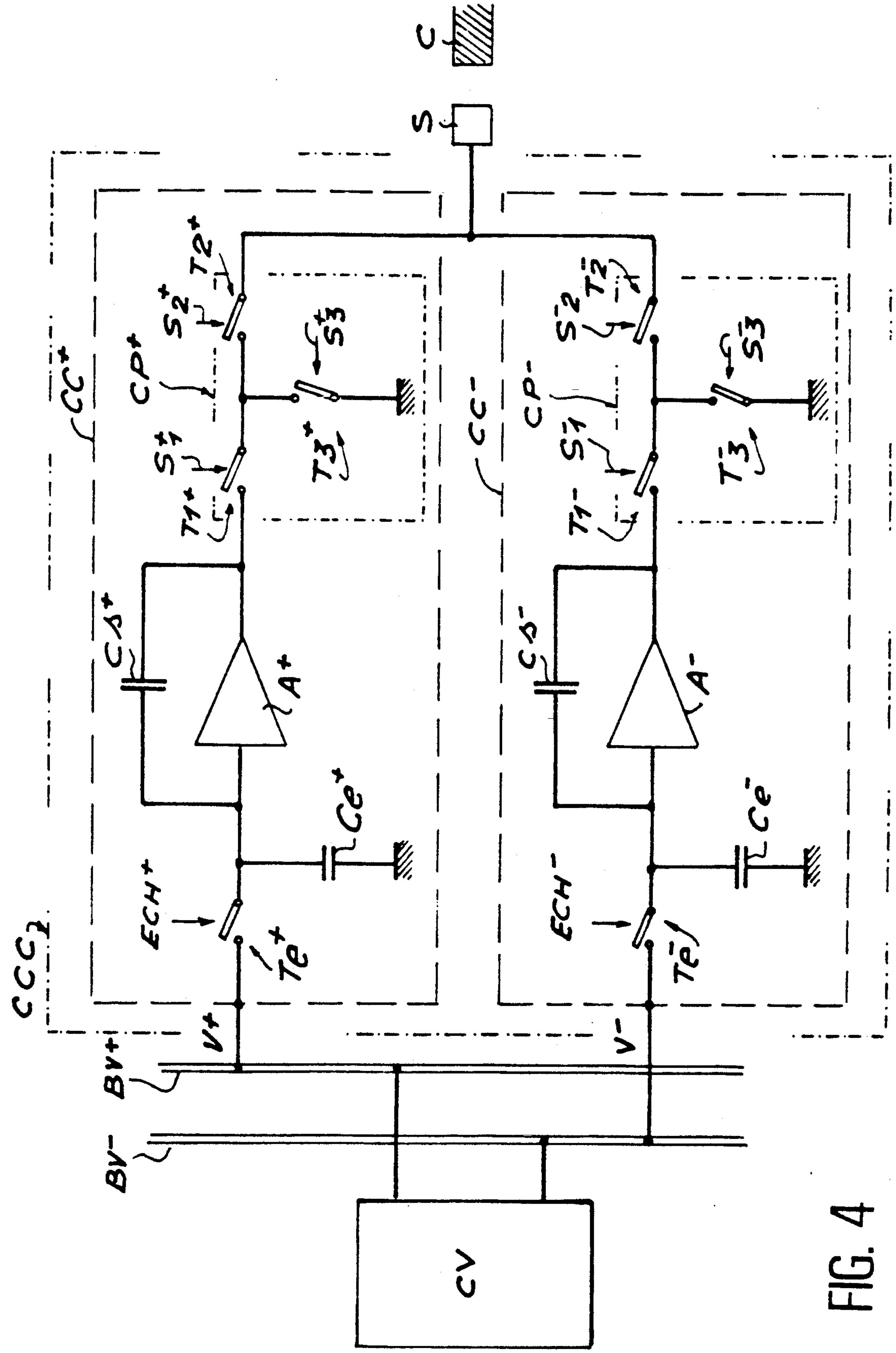
FIG. 4 shows a double control circuit according to the invention.

FIG. 4 shows a double column control circuit CC for a display screen, comprising a circuit CC+ working with a video signal V+ and a circuit CCC working with a video signal V−. These two circuits work alternately, as is the case in the control circuits of liquid crystal display screens in which the voltage applied to the liquid crystal sees its sign alternate from one scanning line to the next. The two video signals V+ and V− are delivered by a video circuit CV which supplies two video buses, one positive BV+, the other negative BV−.

Circuit CC+ comprises a sampling capacitor Ce+ connected to a sampling transistor Te+ controlled by a sampling signal ECH+, an amplifier A+ with, in parallel, a storage capacitor Cs+, elements Te+, Ce+, A+, Cs+ constituting a sample and hold circuit. Circuit CC+ is completed by a protective circuit CP+ with three transistors T1+, T2+, T3+.

Circuit CC− is identical with circuit CC+ and comprises the same elements designated by the same references bearing a − sign instead of a + sign.

Two circuits CC+ and CC− have their outputs connected to the same pin S, which is connected to a column C of a display screen. The control signals of the transistors of the protective circuits are complementary, i.e., $S1^- = \overline{S1^+}$, $S2^- = \overline{S2^+}$ and $S3^- = \overline{S3^+}$ (where the bar means "logical complement"). Further, S3+ (or S3−) is the complement of S1+ (or S1−). In other words, switch T3+ (or T3−) is always in the state opposite to that of switch T1+0 (or T1−) (see FIG. 3). The control logic of CC+ is between 0 and VDD while the control logic of CC− is between VSS and 0.

Figure 5:
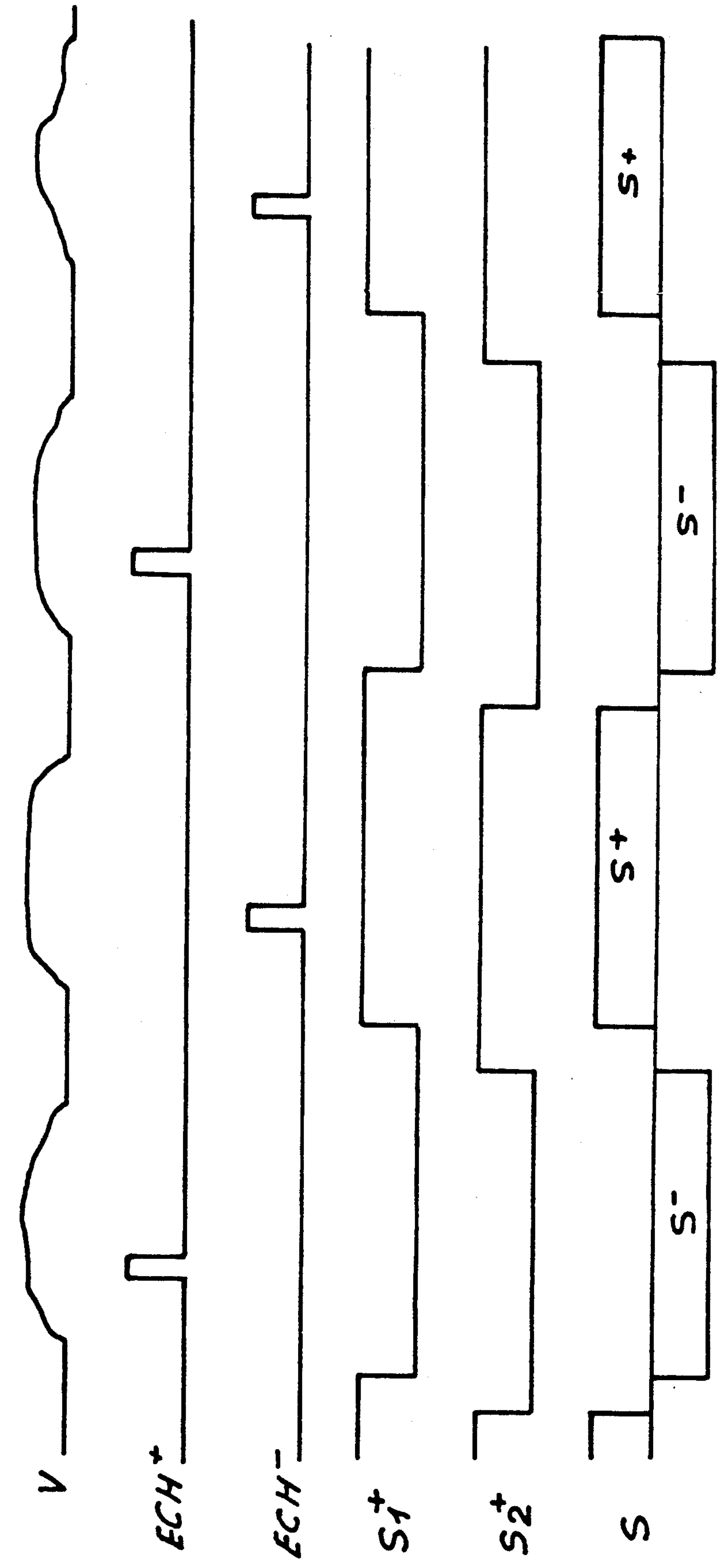
FIG. 5 is a timing diagram relative to the circuit of the preceding figure.

The operation of the double circuit of FIG. 4 is illustrated by the timing diagram of FIG. 5. Video signal V is represented in the first line. Two sampling pulses ECH+ and ECH− are represented on the next two lines. The fourth line shows pulse S+ which defines the state of switch $T1^{30}$ as well as, by complement, the state of T3+, the state of T1− and the state of T3−. The fifth line shows pulse S2+ which defines the state of switch T2+, as well as, by complement, the state of T2−. The last line shows the sampled and held output signal, alternately positive S+ and negative $S^{31}$.

The circuit described above is not limited to the control of display screens but can be applied to other techniques of electronics.

What is claimed as new and desired to be secured by Letters Patent of the United States is:

1. A protective circuit, included in a column control circuit, for protection against excessive voltages appearing on an output terminal which is external to said column control circuit, connected between an output of a control circuit means for supplying a voltage signal and said output terminal, comprising:

first and second electronic switches connected in series between said output of the control circuit and the output terminal;

a third electronic switch connected to a point located between said first and second switches also connected to a ground terminal;

means for delivering control signals to said first, second and third switches in accordance with corresponding voltage signals delivered by the control circuit means.

2. The protective circuit according to claim 1, wherein a voltage signal is transferred from the control circuit to the output terminal when said first and second switches are in closed state and said third switch is in an open state.

3. A protective circuit according to claim 1, wherein said point located between said first and second switches is set to a zero potential when said first and second switches are in an open state and said third switch is in a closed state.

4. The protective circuit according to claim 1, wherein said output terminal is set to a zero potential when the second and third switches are each in a closed state.

5. The protective circuit according to claim 1, wherein said control circuit means is a sample and hold circuit.

6. The protective circuit according to claim 5, wherein said sample and hold circuit is used to sample, store and transfer video signals.

7. The protective circuit according to claim 1, wherein the output terminal is connected to a column line of a liquid crystal display device.

8. A double column control circuit, for protection against excessive voltages appearing on an output terminal which is external to said double column control circuit, comprising:

a first protective circuit, connected between an output of a first control circuit means for supplying a first voltage signal and said output terminal, said first protective circuit comprising first and second electronic switches connected in series between said output of the first control circuit means and the output terminal, and a third electronic switch connected to a point between said first and second switches and also connected to a first ground terminal;

a second protective circuit, connected between an output of a second control circuit means for supplying a second voltage signal and said output terminal, said second protective circuit comprising fourth and fifth electronic switches connected in series between said output of the second control circuit means and the output terminal, and a sixth electronic switch connected to a point located between said fourth and fifth switches and also connected to a second ground terminal; and mean for delivering a first set of control signals to said first, second and third electronic switches in accordance with corresponding first type voltage signals delivered by the first control circuit means, and for delivering a second set of control signals to said fourth, fifth and sixth electronic switches in accordance with corresponding second type voltage signals, said second type voltage signals being delivered by said second control circuit means, wherein said first and second protective circuits operate alternately with each other in accordance with alternating opposite-polarity input signals.

9. A protective circuit, included in a column control circuit, for protection against excessive voltages appearing on an output terminal which is external to said column control circuit, connected between an output of a control circuit means for supplying a voltage signal and said output terminal, comprising:

first and second electronic switches connected in series between said output of the control circuit and the output terminal;

a third electronic switch connected to a point located between said first and second switches also connected to a ground terminal;

means for delivering control signals to said first, second and third switches in accordance with corresponding voltage signals delivered by the control circuit means, wherein when said voltage signal is to be transferred from the control circuit to the output terminal, said first and second switches are maintained in a closed state and said third switch is maintained in an open state.

10. A protective circuit according to claim 9, wherein said point located between said first and second switches is set to a zero potential when said first and second switches are maintained in an open state and said third switch is maintained in a closed state.

11. The protective circuit according to claim 9, wherein said output pin is set to a zero potential when the second and third switches are each maintained in a closed state.

12. The protective circuit according to claim 9, wherein said control circuit means is a sample and hold circuit.

13. The protective circuit according to claim 12, wherein said sample and hold circuit is used to sample, store and transfer video signals.

14. The protective circuit according to claim 9, wherein the output terminal is connected to a column line of a liquid crystal display device.

15. A double column control circuit, for protection against excessive voltages appearing on an output terminal which is external to said double column control circuit, comprising:

a first protective circuit, connected between an output of a first control circuit means for supplying a first voltage signal and said output terminal, said first protective circuit comprising first and second electronic switches connected in series between said output of the first control circuit means and the output terminal, and a third electronic switch connected to a point between said first and second switches and also connected to a first ground terminal;

a second protective circuit, connected between an output of a second control circuit means for supplying a second voltage signal and said output terminal, said second protective circuit comprising fourth and fifth electronic switches connected in series between said output of the second control circuit means and the output terminal, and a sixth electronic switch connected to a point located between said fourth and fifth switches and also connected to a second ground terminal; and means for delivering a first set of control signals to said first, second and third electronic switches in accordance with corresponding first type voltage signals delivered by the first control circuit means, and for delivering a second set of control signals to said fourth, fifth and sixth electronic switches in accordance with corresponding second type voltage signals which are complementary to said first type voltage signals, said second type voltage signals being delivered by said second control circuit means, wherein said first and second protective circuits operate alternately with each of the in accordance with alternating opposite-polarity input signals and when said first voltage signal is to be transferred from said first control circuit means to said output terminal said first and second switches are maintained in a closed state and said third switch is maintained in an open state, whereas when said second voltage signal is to be transferred from said second control circuit means to said output terminal said fourth and fifth switches are maintained in a closed state and said sixth switch is maintained in an open state.

* * * * *